United States Patent [19]
Hinshaw et al.

[11] Patent Number: 5,464,054
[45] Date of Patent: Nov. 7, 1995

[54] SPRING CLAMP AND HEAT SINK ASSEMBLY

[75] Inventors: Howard G. Hinshaw, Dallas; Keith R. Moulton, Argyle; Donald L. Bland, Ft. Worth, all of Tex.

[73] Assignee: Thermalloy, Inc., Dallas, Tex.

[21] Appl. No.: 283,535

[22] Filed: Aug. 1, 1994

Related U.S. Application Data

[63] Continuation of Ser. No. 103,564, Aug. 9, 1993, abandoned.
[51] Int. Cl.⁶ .............................. F28F 7/00; H05K 7/20
[52] U.S. Cl. .................. 165/80.3; 165/185; 174/16.3; 361/704; 257/718; 257/719
[58] Field of Search .................. 165/80.3, 185; 174/16.3; 257/718, 719, 722; 361/704, 707, 709, 717, 718, 722

[56] References Cited

U.S. PATENT DOCUMENTS

| | | | |
|---|---|---|---|
| 4,509,839 | 4/1985 | Lavochkin | 257/718 |
| 5,251,101 | 10/1993 | Liu | 361/717 |

*Primary Examiner*—Leonard R. Leo
*Attorney, Agent, or Firm*—Crutsinger, Booth & Kanz

[57] ABSTRACT

A mounting clip for securing a heat sink to a device package is secured to the heat sink by forming a groove in the heat sink, positioning the central body portion of the clip in the groove and deforming the wall of the groove to trap the clip in the groove. The clip is an elongated body with ends extending from the axis of its central body. The ends may be trapped or hooked in appropriate receivers on a frame or socket holding an electronic device package to secure the heat sink adjacent the device package.

11 Claims, 1 Drawing Sheet

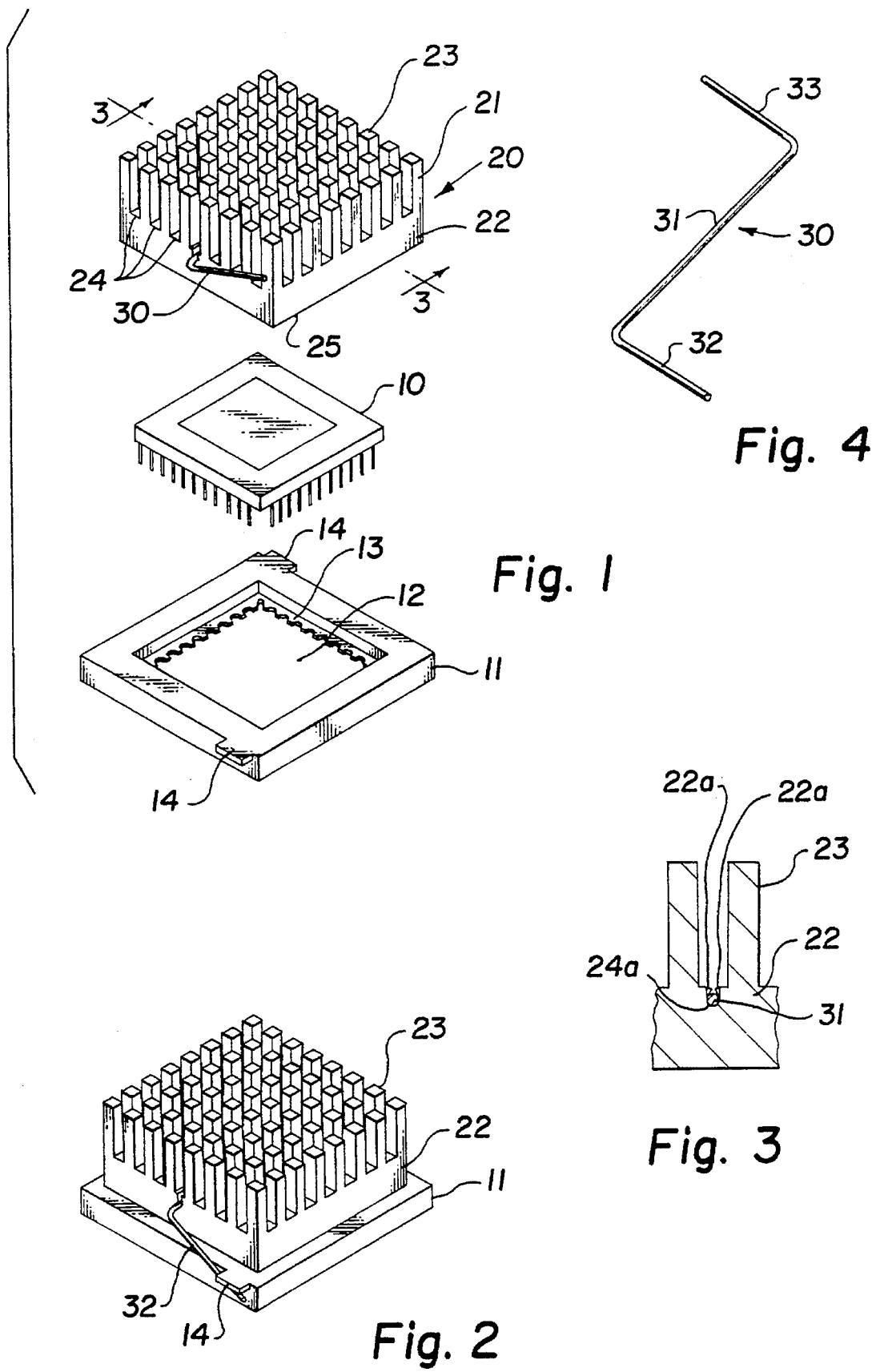

SPRING CLAMP AND HEAT SINK ASSEMBLY

This is a continuation of application Ser. No. 08/103,564 filed Aug. 9, 1993 entitled Spring Clamp and Heat Sink Assembly, now abandoned.

This invention relates generally to apparatus for securing electronic components to heat sinks for dissipation of thermal energy. More particularly, it relates to an assembly of a clamp and a heat sink arranged to secure the heat sink to and in thermal communication with an electronic device package.

Advances in microelectronics technology tend to develop device chips which occupy less physical space while performing more electronic functions. Conventionally, the chips are packaged for use in housings which protect the chip from its environment and provide means for input/output communication between the chip and external circuitry. The continuing drive toward miniaturization thus results in generation of more heat in less physical space with less structure for removing the heat from the package. Similarly, the development of electronic circuit device chips using compound semiconductors further expands the requirements for packaging which can contain devices for operating at higher temperatures and control device temperatures by heat dissipation.

In order to conduct heat from the chip to the exterior of the package, many device packages include a high thermal conductivity transfer medium which is in thermal communication with the chip and has a dissipation surface adjacent the surface of the package. Other packages merely conduct the heat through the package itself. However, in order to dissipate heat from the package, an external heat sink must be attached to the device package. Typically, the heat sink is a body of material such as metal which has a high thermal conductivity. The heat sink ordinarily has at least one flat face for positioning adjacent a face of the device package and may include fins, pins or other structures for dissipating thermal energy into the surrounding atmosphere.

To be effective, the heat sink must occupy as little space as possible while dissipating maximum amounts of thermal energy. It is also desireable that the heat sink be readily attachable to and removeable from the device package and adaptable for connection to a wide variety of different device packages. Where large numbers of the devices are used in an assembly process, economics demand that the assembly process, including assembly of heat sinks, etc., be simple, automatible, versatile and reliable. Accordingly, attaching heat sinks by adhesives, screws, bolts and the like is highly undesireable. Attachment by simple clips and the like is much preferred because it is fast and usually very easy.

In accordance with the present invention, a heat sink assembly is provided in which a simple spring clip is used to attach the heat sink to a socket, frame or other attachment support to secure the heat sink to a device package. The clip comprises an elongated base portion which traverses one surface of the heat sink and is positioned in a groove or channel therein. The base portion is permanently journaled within the groove or channel so that the ends of the clip project from the heat sink and may be used for securing the heat sink to an attachment support which supports the device package. However, the clip is permanently secured to the heat sink so that the heat sink and clip can be handled as a complete subassembly, thus reducing the number of loose parts and assembly steps in the assembly operation. The combination of the invention may take various forms and is suitable for use in a wide variety of assembly operations. By securing the attachment clip to the heat sink, the assembly operation is simplified and thus less expensive and more reliable.

Other features and advantages of the invention will become more apparent from the following description taken in connection with the appended claims and attached drawing in which:

FIG. 1 is an exploded view of an assembly comprising a device package, an attachment frame and the preferred heat sink and attachment clip subassembly of the invention;

FIG. 2 is a perspective view of the assembly of FIG. 1;

FIG. 3 is a fragmentary sectional view of the heat sink and clip subassembly of FIG. 1 taken through lines 3—3; and FIG. 4 is a perspective view of the clip of the assembly of FIG. 1.

A subassembly illustrating the preferred embodiment of the invention is shown in combination with an electronic device package 10 and a mounting frame 11 in FIGS. 1 and 2. As illustrated in the drawing, the subassembly 20 comprises a heat sink 21 and a mounting strap or clamp 30 secured thereto. The heat sink 21 illustrated comprises a body 22 of thermally conductive material such as aluminum, aluminum alloy, copper or the like having a substantially flat first major face 25 and elongated pins 23 extending from the opposite face. In the preferred embodiment, pins 23 are formed by cutting across parallel fins which were previously formed by extruding or by sawing parallel grooves in the body 22. Regardless of the method of manufacture, the body 22 has at least a plurality of parallel grooves or channels 24 extending in a first direction to form fins for conducting heat from the body 22 into the surrounding atmosphere.

The preferred embodiment of the mounting device is a clamp 30 having an elongated central body portion 31 defining a major axis with end portions 32 and 33 extending in substantially opposite directions normal to the axis of the central body portion 31 to define a substantially Z-shaped device. The clamp 30 can be formed from any suitable material which is flexible but resilient such as a rod or heavy wire of steel, aluminum or the like.

As illustrated in FIGS. 1 and 3, the central body portion 31 of clamp 30 is positioned in a groove 24a. Groove 24a may be one of parallel channels 24 or a narrower channel or groove formed in the base of one of the channels 24 and is sufficiently deep to receive the elongated central body portion 31 of clamp 30. The end portions 32, 33 are positioned on opposite sides of the body 22 and the central portion 31 is trapped in groove 24a by deforming portions of the body 20 adjacent the groove 24a to form tabs 22a projecting into the groove 24a and over the central body portion 31 as shown in FIG. 3. It will be recognized that only small portions 22a need be deformed to entrap the central body portion 31 since little stress is placed on the deformed tabs 22a. Such tabs 22a may be formed, for example, by a stamping tongue or the like to spread a portion of the inner walls of the groove 24a inwardly. By trapping the central body portion as described, the clamp 30 is journaled in the groove 24a and permanently secured therein.

Attachment of the heat sink to an electronic device package using the subassembly 20 is illustrated in FIGS. 1 and 2. In the embodiment illustrated, a frame 11 having an open center 12 and a recessed ledge 13 is used to support the device package 10 about its periphery. It will be recognized that frame 11 is used only to provide means for securing the heat sink to the device package and thus may take many forms, depending on the configuration of the package 10. For example, frame 11 may only receive the corners of the package 10 or may take the form of a shoe or clip which attaches to a portion of the periphery of the device package. The frame 11, regardless of its physical arrangement, provides means for receiving the ends 32, 33 of the clamp 30. In the embodiment illustrated, the frame 11 has tabs 14 extending laterally outwardly from opposite sides thereof near diagonally disposed corners. As illustrated in FIGS. 1 and 2, the device package 10 is positioned within the frame 11 and flat face 25 of the heat sink positioned adjacent the top face of the device package 10. The assembly is secured together by forcing ends 32, 33 under tabs 14 on the frame 11.

It will be realized that by securing the clamp 30 in the heat sink body 22 the subassembly 20 may be shipped, handled and assembled as a unit. By securing the parts together, many problems associated with loose parts are eliminated and attachment of the subassembly 20 to a device package is much easier and may even be automated. It will also be recognized that the frame 11 may be totally eliminated where the electronic device is positioned in mounting apparatus such as a socket or the like. The socket may have tabs such as tabs 14 for receiving the ends 32, 33 of the clamp or the ends 32, 33 of the clamp may be formed to fit into recesses in the mounting apparatus or under the mounting apparatus. Various other arrangements for securing the ends of the clamp to the mounting apparatus may be devised to utilize the subassembly of the invention.

Although the invention has been described with particular reference to a clamp which is Z-shaped and attaches to a frame, the form of the invention illustrated is to be taken as illustrative of the principles thereof. The clamp 30 may take various other shapes and yet be capable of being secured to a heat sink as described herein. Accordingly, it is to be understood that the forms of the invention shown and described in detail are to be considered examples only and that various changes, modifications and rearrangements may be resorted to without departing from the spirit and scope of the invention as defined by the appended claims.

What is claimed:

1. In combination:
   (a) a heat sink comprising a body of thermally conductive material having at least one substantially flat first major face and a second major face disposed substantially parallel with said first major face with fins extending from said second major face and a groove in said second major face between said fins and extending substantially parallel with said first major face; and
   (b) a mounting device having an elongated central portion and first and second end portions, said central portion positioned and secured within said groove by tabs deformed from short sections of said body adjacent said groove which project over short portions of and entrap said elongated central portion of said mounting device in said groove with said end portions projecting from opposite ends thereof.

2. The combination defined in claim 1 wherein said heat sink includes a plurality of fins projecting from said second major face and said groove is parallel with and lies between two of said fins.

3. The combination defined in claim 2 wherein said fins are defined by rows of pins.

4. The combination defined in claim 1 wherein said mounting device comprises an elongated central portion defining a first axis and end portions extending from said central portion in a direction substantially normal to the axis of said central portion.

5. The combination defined in claim 1 wherein said mounting device is an elongated body of spring material with a central body portion and ends extending in substantially opposite directions from said central body portion.

6. The combination defined in claim 1 including an electronic device package having a substantially flat major face positioned adjacent and in thermal communication with said first major face of said heat sink.

7. The combination defined in claim 6 including mounting apparatus cooperating with said mounting device to secure said heat sink to said electronic device package.

8. The combination defined in claim 7 wherein said mounting apparatus comprises a socket for receiving input/output leads extending from said electronic device package.

9. The combination defined in claim 7 wherein said mounting apparatus comprises an open frame which receives and supports the electronic device package about its periphery.

10. The combination defined in claim 1 wherein said central portion is journaled in said groove.

11. In combination:
    (a) a heat sink comprising a body of thermally conductive material having at least one substantially flat first major face and a second major face disposed substantially parallel with said first major face with a groove in said second major face extending substantially parallel with said first major face; and
    (b) a mounting device having an elongated central portion and first and second end portions, said central portion positioned and secured within said groove by tabs deformed from short sections of said body adjacent said groove which project over short portions of and entrap said elongated central portion of said mounting device in said groove with said end portions projecting from opposite ends thereof.

* * * * *